(12) United States Patent
Wagers et al.

(10) Patent No.: US 6,563,197 B1
(45) Date of Patent: May 13, 2003

(54) MOSGATED DEVICE TERMINATION WITH GUARD RINGS UNDER FIELD PLATE

(75) Inventors: Kenneth Wagers, Los Angeles, CA (US); Yanping Ma, Temecula, CA (US); Jianjun Cao, Temecula, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 09/989,217

(22) Filed: Nov. 20, 2001

(51) Int. Cl.[7] ................................................ H01L 29/78

(52) U.S. Cl. ........................................ 257/630; 257/652

(58) Field of Search ................................. 257/630, 652

(56) References Cited

U.S. PATENT DOCUMENTS

| 4,399,449 A | * | 8/1983 | Herman et al. |
| 4,567,502 A | * | 1/1986 | Nakagawa et al. |
| 5,113,237 A | * | 5/1992 | Stengl |
| 5,155,568 A | * | 10/1992 | Pernyesgi |

FOREIGN PATENT DOCUMENTS

WO    WO-96/13857    *   5/1996

\* cited by examiner

*Primary Examiner*—Stephen D. Meier
(74) *Attorney, Agent, or Firm*—Ostrolenk, Faber, Gerb & Soffen, LLP

(57) ABSTRACT

Guard ring diffusions in the termination of a MOSgated device are laterally spaced from one another and are disposed beneath and are insulated from the termination field plate which extends from the periphery of the device active area.

8 Claims, 2 Drawing Sheets

MOSGATED DEVICE TERMINATION WITH GUARD RINGS UNDER FIELD PLATE

FIELD OF THE INVENTION

This invention relates to semiconductor devices and more specifically relates to a termination structure for a MOSgated device.

BACKGROUND OF THE INVENTION

MOSgated semiconductor devices such as MOSFETS, IGBTs and the like must have termination structures surrounding the active device area to prevent breakdown at the peripheral edge of the die or chip. Thus, the breakdown voltage of MOSgated device is frequently limited by the termination rather than by the active area. Termination structures employ conductive field plates and floating guard ring diffusions which are laterally separated from the guard rings. If the termination has a sufficiently high breakdown voltage, it becomes possible to increase the concentration of the epitaxially formed drift region of the active area, thus reducing its resistance $R_{DSON}$ when the device is turned on.

Such terminations use a certain silicon area, thus reducing the percentage of the chip area devoted to active area. Thus, as terminations are made to support higher breakdown voltage, they also require more area, thus reducing the active area of a given chip and offsetting the reduced $R_{DSON}$ benefit.

It would be desirable to provide a termination for a MOSgated device which employs both field plates and guard ring diffusions while taking a reduced area of a given chip or die.

SUMMARY OF THE INVENTION

In accordance with the invention the guard ring diffusions which are usually spaced from the field plate, and which provide the benefit of grading the electric field from the border of the active region to the street or edge of the die are disposed beneath the field plate. It has been found that the new termination permits a 25% reduction in $R_{DSON}$ of a MOSFET of a given voltage rating and die size because it uses less area, permitting an increase in active area for a given die size, and because it enables an increase in the concentration of the body or drift region.

In particular, for a power MOSFET rated at a breakdown voltage of 200 volts, and a rectangular die area of 2.8 mm by 3.6 mm the novel termination permitted a decrease in termination area from 1.7 mm$_2$ to 1.1 mm$^2$ and a decrease in the resistivity of the epitaxial silicon body region of 5.7 ohm cm to 4.7 ohm cm. The on resistance of the die was reduced from about 0.19 ohms to 0.14 ohms.

DETAILED DESCRIPTION OF THE DRAWINGS

Figure 1:
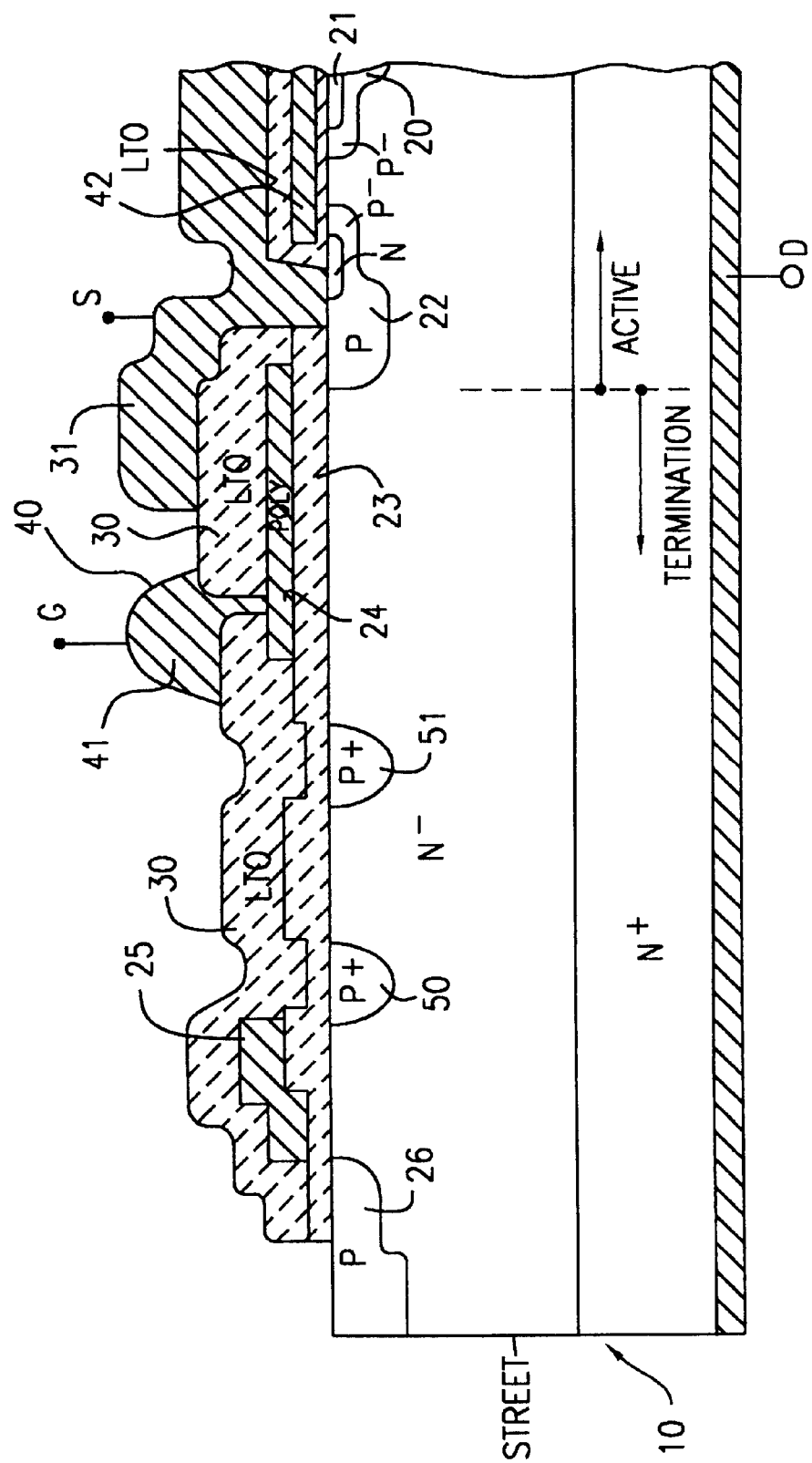
FIG. 1 is a cross section of the termination of a prior art MOSFET using a laterally displaced field plate and a set of guard ring diffusions.

Referring first to FIG. 1, there is shown a prior art termination for a vertical conduction N channel Power MOSFET comprising a die 10 formed on a monocrystaline N$^+$ substrate 11 having an epitaxially deposited N$^-$ layer 12 thereon. For a device rated at a breakdown voltage of 200 volts, N$^-$ layer 12 has a thickness of 23 microns and a resistivity of 5.7 ohm cm. The die may have any desired shape and area and typically may be a rectangle having dimensions of about 2.8 mm by 3.6 mm and 250 microns thick. While the invention is described in connection with an N channel MOSFET device, it will be understood that the invention is applicable to any MOSgated device, including IGBTs and to P channel devices in which all conductivity types to be described are reversed.

The active section of the device includes P channel diffusion 20 which contain N$^+$ sources 21. The outermost channel diffusion 22 is a half cell, as shown in more detail in U.S. Pat. No. 6,180,981. Half cell 22 has an overlying field oxide layer 23 and a conductive polysilicon field plate 24 which overlies field oxide 23 and the junction of region 22. A second polysilicon field plate 25 is located atop the field oxide 23 and over P diffusion 26 which extends to the street of the die. An LTO insulation oxide 30 overlies field plates 24 and 25. The aluminum source electrode 31 overlies LTO layer 30 and is connected to the source regions 21 and channel regions 21 and 22 in the area shown and to all source and channel regions in the active area. The aluminum source electrode 31 is separated at gap 40 to define a gate runner 41 which is connected to polysilicon field plate 24 and to all polysilicon gates, that is, the MOSFET gate poly segment 42 which is internally connected (not shown) to the polysilicon gate lattice of which gate poly 42 is one segment.

In order to graduate the electric field extending from the exterior of the active region and toward the die street, one or more floating guard ring diffusions, shown as P diffusions 50 and 51 in FIG. 1, are used. These diffusions are normally placed between the left hand edge of field plate 25 and the right hand edge of field plate 24. This requires a large lateral dimension and increases the area of the die 10 occupied by the termination region.

Figure 2:
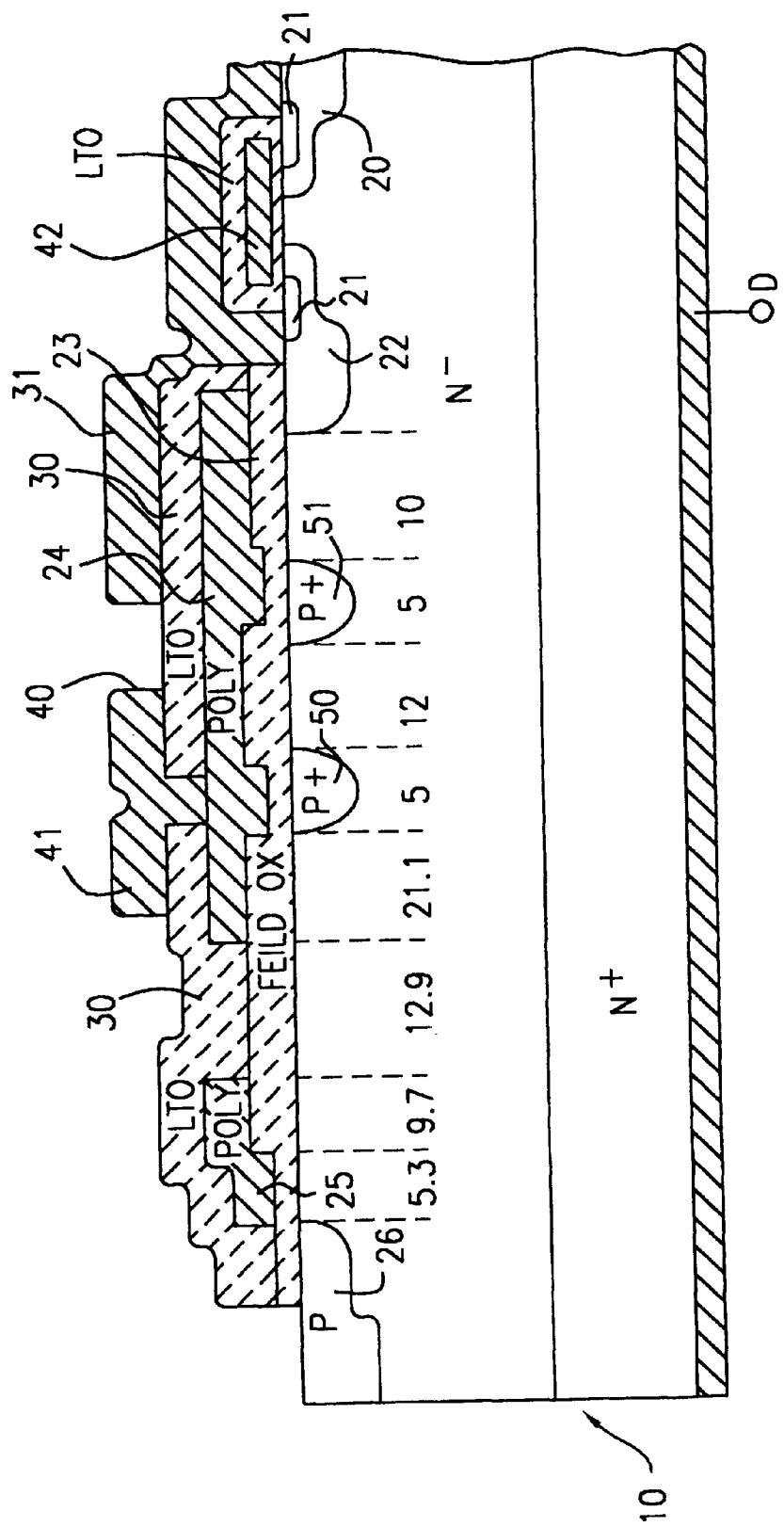
FIG. 2 is a cross section like that of FIG. 1 in which the guard ring diffusions are disposed beneath the filed plate.

The novel invention is shown in FIG. 2 where parts similar to those of FIG. 1 have the same identifying numeral. FIG. 2 differs from FIG. 1 in that the P guard ring diffusions 50 and 51 (or any desired number of spaced diffusions) are disposed beneath the field plate 24. The specific spacings used are identified in microns on FIG. 2 for a 200 volt die of dimensions 2.8 mm by 3.6 mm.

This novel relocation of guard rings 50 and 51 saves the lateral space required in the prior art as shown in FIG. 1 since the space between the edge of field plate 24 and the street of the die is considerably reduced (for example, by 47 microns). Thus, for a die of given area (of the area of the die of FIG. 1), a larger percentage of the die area can be devoted to active area, thus reducing on-resistance. Further, it has been found that the resistivity of the N$^-$ silicon can be decreased (from 5.7 ohm cm to 4.7 ohm cm) when using the invention, to result in a reduction of about 25% in the on-resistance of the prior art die of FIG. 1.

In the specific embodiment of FIG. 2, the following thickness dimensions were used for the various layers shown:

| | |
|---|---|
| Electrodes 31, 41 | 8 microns |
| LTO 30 | 7,000 Å |
| Polysilicon 24, 25 | 10,000 Å |
| Field Oxide 23 | 10,000 Å |

-continued

| | |
|---|---|
| P⁺oxide (atop diffusions 50, 51) | 3,050 Å |
| Gate oxide (beneath gate poly 42 | 1,500 Å |

Although the present invention has been described in relation to particular embodiments thereof, many other variations and modifications and other uses will become apparent to those skilled in the art. It is preferred, therefore, that the present invention be limited not by the specific disclosure herein

What is claimed is:

1. A termination structure for a MOSgated die; said MOSgated die having an active area having an outer periphery and a termination area surrounding said active area and extending to the edge of said die; a field oxide covering the upper surface of said die and extending from a position overlapping the outer edge of said active area and toward said edge of said die; a conductive polysilicon field plate overlying said field oxide and at least a portion of the edge of said active area and insulated from said active area by said field oxide; and at least one floating guard ring diffusion in said upper surface of said die which encircles said die and is disposed entirely beneath said field plate, whereby said at least one floating guard ring diffusion is not laterally spaced from the field plate.

2. The termination structure of claim 1, which includes a plurality of radially spaced guard ring diffusions each disposed entirely beneath said field plate.

3. The termination structure of claim 1, wherein said MOSgated die is a vertical conduction MOSFET and wherein said active area comprises a plurality of channel regions and respective source regions which define invertible channel regions, and a polysilicon gate electrode overlying said invertible channel region between said channel regions and their respective source regions; and an LTO layer disposed atop at least a portion of said polysilicon field plate and a portion of said active area; and a metal source electrode disposed atop at least a portion of said LTO layer and connected to said channel and source regions.

4. The termination structure of claim 1, wherein said active area comprises a plurality of channel regions and respective source regions and a polysilicon gate electrode overlying the invertible channel region between said channel regions and their respective source regions; and an LTO layer disposed atop at least a portion of said polysilicon field plate and a portion of said active area and a metal gate terminal electrode disposed atop at least a portion of said LTO layer and connected to said polysilicon gate electrode.

5. The termination structure of claim 3, which further includes a metal gate terminal electrode disposed atop at least a portion of said LTO layer and connected to said polysilicon gate electrode.

6. The termination structure of claim 3, which includes a plurality of radially spaced guard ring diffusions each disposed entirely beneath said field plate.

7. The termination structure of claim 4, which includes a plurality of radially spaced guard ring diffusions each disposed entirely beneath said field plate.

8. The termination structure of claim 5, which includes a plurality of radially spaced guard ring diffusions each disposed entirely beneath said field plate.

\* \* \* \* \*